United States Patent

[11] 3,614,467

[72] Inventor George K. Tu
Wappingers Falls, N.Y.
[21] Appl. No. 48,200
[22] Filed June 22, 1970
[45] Patented Oct. 19, 1971
[73] Assignee Cogar Corporation
Wappingers Falls, N.Y.

[54] NONSATURATED LOGIC CIRCUITS COMPATIBLE WITH TTL AND DTL CIRCUITS
13 Claims, 2 Drawing Figs.

[52] U.S. Cl. .......... 307/215, 307/214, 307/237, 307/280, 307/300
[51] Int. Cl. .......... H03k 5/08, H03k 19/36
[50] Field of Search .......... 307/214, 215, 218, 237, 280, 281, 299 A, 300

[56] References Cited

UNITED STATES PATENTS

| | | | |
|---|---|---|---|
| 3,394,268 | 7/1968 | Murphy | 307/214 X |
| 3,229,119 | 1/1966 | Bohn et al. | 307/214 X |
| 3,233,125 | 2/1966 | Buie | 307/215 |
| 3,473,047 | 10/1969 | Bohn et al. | 307/215 |

OTHER REFERENCES

IBM Technical Disclosure Bulletin, Vol. 8, No. 2 7/1965, p. 317 Atwood, " Logic Circuit"
Atkins, "Non-linear Delay Improvement," IBM technical Disclosure Bulletin, Vol. 8, No. 1, 6/1965, p. 195

*Primary Examiner*—Donald D. Forrer
*Assistant Examiner*—L. N. Anagnos
*Attorney*—Harry M. Weiss

ABSTRACT: A nonsaturated logic circuit compatible with TTL and DTL circuits. The output transistor of the logic circuit has its base terminal connected to the junction of a resistor divider pair and its collector terminal connected through a diode to the drive input of the resistor pair. When current flows through the resistor divider pair to turn on the transistor, the diode conducts and the collector of the output transistor is clamped to a voltage higher than that which would otherwise be obtained in the absence of the diode. The transistor does not saturate and the transistor can then be turned off rapidly.

PATENTED OCT 19 1971 3,614,467
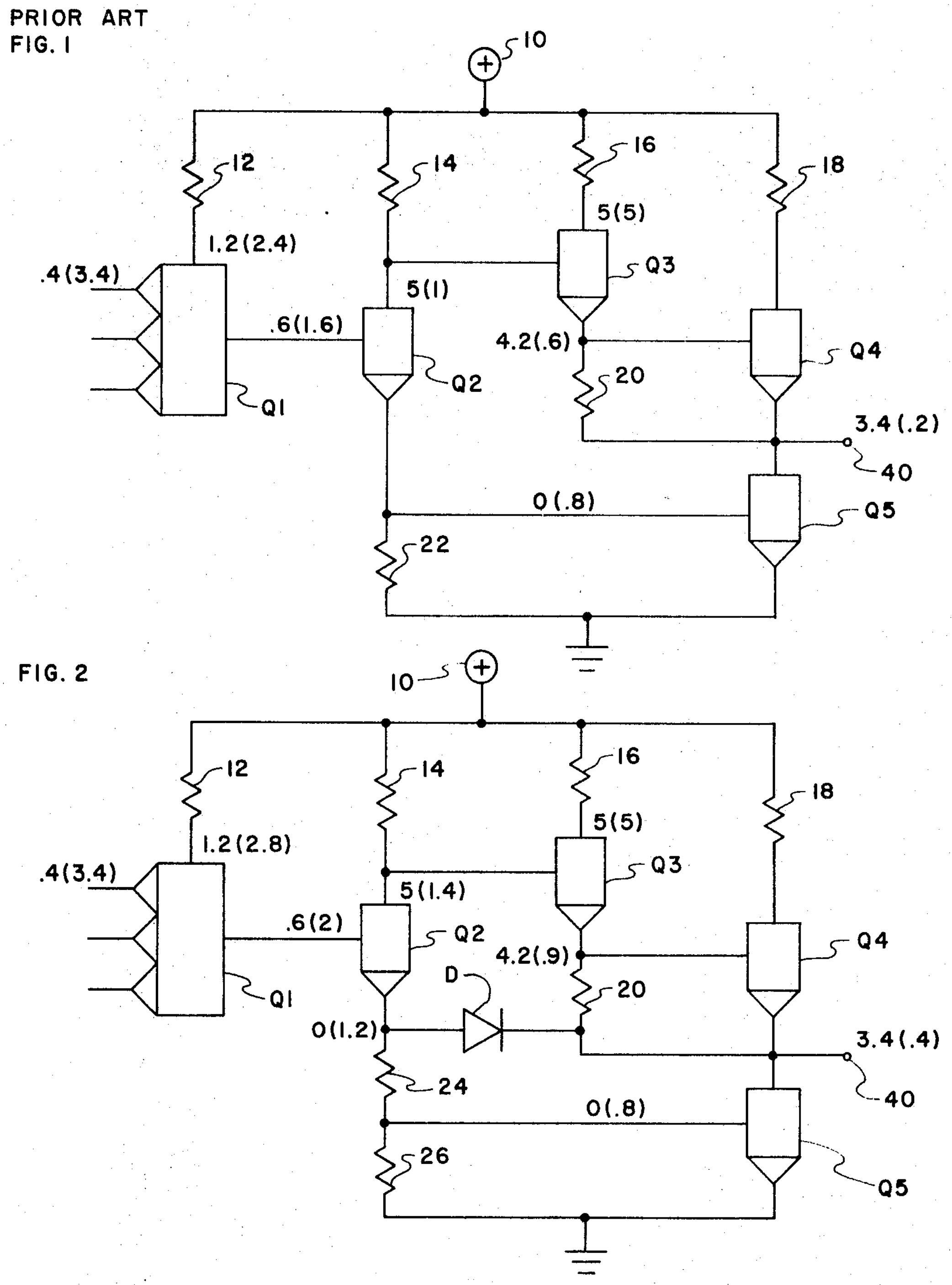
PRIOR ART FIG. 1, FIG. 2
INVENTOR
GEORGE K. TU
Amster & Rothstein
BY Harry M Weiss
ATTORNEYS

NONSATURATED LOGIC CIRCUITS COMPATIBLE WITH TTL AND DTL CIRCUITS

This invention relates to logic circuits compatible with TTL and DTL circuits, and, more particularly, to nonsaturated logic circuits of this type.

In TTL (transistor-transistor-logic) circuits, the output transistor of a logic stage typically has its collector voltage switch between levels of approximately 0.2 and 3.4 volts. These levels are sufficient to prevent or control the driving of the input transistor in a succeeding stage. Similar remarks apply to DTL (diode-transistor-logic) circuits, these circuits being operated at generally the same voltage levels. The differences between the two types of circuits are well known to those skilled in the art; although reference hereinafter is made to TTL circuits, it is to transistor understood that the logic circuit of my invention is equally applicable to DTL circuits which have the same voltage operating levels as TTL circuits.

Typically, the output transistor of a logic stage has its emitter terminal connected to ground. The output of the stage is taken at the collector of the transistor. When the transistor is turned off, the collector of the transistor is held at a high potential, for example, 3.4 volt as as mentioned above. On the other hand, when the transistor is turned on, there is a small voltage drop across the collector and emitter terminals of the transistor and the output voltage drops toward ground. If the transistor saturates, as is the usual case, the output potential is in the order of 0.2 volts.

TTL circuits of the type described are advantageous in that they provide a high degree of noise immunity, consume little standby power and permit small chip configurations. However, TTL circuits suffer from a major disadvantage which results from the fact that the transistor at the output of the circuit is saturated when it is conducting. With a low output (collector) voltage, the transistor stores considerable charge (primarily due to the base-collector capacitance), which charge must be removed before the transistor can be turned off. Consequently, even though the base of the transistor may subsequently be lowered in potential to turn the transistor off, until the stored charge is removed, the transistor conducts current and the output potential remains low. This not only slows down the operation of the device, but also contributes to the well-known skewing (phenomenon) whereby different transistors, even on the same chip, turn off with different speeds.

It is a general object of my invention to provide a logic circuit whose output transistor does not saturate in order that the transistor be capable of turning off rapidly.

Briefly, this is accomplished by clamping the collector of the transistor through a diode to the drive voltage extended to the base of the transistor. In the illustrative embodiment of the invention, the collector of the transistor is clamped such that its voltage cannot drop below 0.4 volts due to the incorporation of the diode and a resistor divider network which control both the driving of the base of the transistor and the voltage extended through the diode to the transistor collector. With the collector of the transistor being limited in its downward swing to 0.4 volts, the transistor does not saturate and can turn off rapidly when the base drive is cut off.

It is a feature of my invention to provide a diode emitters, and a voltage divider drive for the base of the output transistor of a logic circuit to limit the downward voltage swing at the collector of the transistor and to prevent the saturation of the transistor when it is turned on.

Further objects, features and advantages of my invention will become apparent upon consideration of the following detailed description in conjunction with the drawing, in which:

FIG. 1 depicts a typical prior art TTL circuit; and

FIG. 2 depicts an illustrative embodiment of my invention.

Referring to the circuit of FIG. 1, various potentials are shown adjacent to several of the transistor terminals. Transistor Q1 serves as a decoder with a different input signal being applied to each of its three emitter terminals. when at least one of the emitter inputs is low in potential (0.4 volts), the transistor conducts and the various terminals in the circuit assume the voltages without the parentheses in the drawing. On the other hand, when all of the input terminals are high in potential (3.4 volts), the various terminals assume the voltages shown in parentheses in the drawing.

When at least one of the emitter input potentials is 0.4 volts or less, base-emitter current flows through transistor Q1. It is assumed that the base-emitter drop of each transistor is 0.8 volts. Consequently, the base of transistor Q1 assumes a voltage of 1.2 volts as a result of current flowing from source 10 through resistor 12 and the base-emitter junction of the transistor. It is further assumed that the emitter-collector potential of a conducting transistor is 0.2 volts. Consequently, the collector potential of transistor Q1 is 0.6 volts.

Since the emitter of transistor Q2 is extended through resistor 22 to ground and the base of the transistor is only 0.6 volts, the base-emitter drop is insufficient to turn the transistor on. The emitter terminal remains at ground potential and the collector of the transistor, extended through resistor 14 to source 10 which has a magnitude of 5 volts, remains at a level of 5 volts. The 5-volt potential is applied to the base of transistor Q3 and this transistor turns on. Transistor Q3 conducts and current flows from source 10 through resistor 16, the transistor and resistor 20 to output terminal 40. Depending on the capacitance at the input of the load connected to terminal 40 (typically, the input circuit of a succeeding stage), the output voltage at terminal 40 starts to rise. It is desirable to drive the load with a large current in order that the output potential at terminal 40 rise rapidly. To increase the current drive, the emitter of transistor Q3 is connected to the base of transistor Q4. Transistor Q4 serves as a current amplifier, current flowing from source 10 through resistor 18 and transistor Q4 to the load. The output voltage rises rapidly due to this large charging current. While transistor Q3 conducts, its collector potential drops. However, as soon as the output voltage rises to the "high" level, transistors Q3 and Q4 turn almost completely off and the collector voltage of transistor Q3 is 5 volts as shown. Transistor Q5 does not conduct because its base terminal is connected through resistor 22 to ground and it is held at ground in the absence of conduction of transistor Q2.

The output voltage appearing at terminal 40 depends upon the input impedance of the load. Assuming that the input impedance is such that transistors Q3 and Q4 remain on with minimum current flowing through them (it is for this reason that the collector of transistor Q3 remains at approximately 5 volts), the drop across each of the base-emitter junctions is 0.8 volts. Consequently, the emitter potential of transistor Q3 is 4.2 volts and the emitter potential of transistor Q4 is 0.8 volts less, or 3.4 volts.

When all three inputs to transistor Q1 are high (3.4 volts), the base-emitter junctions of transistor Q1 are reverse biased. In such a case, the base-collector junction conducts current and functions as an inverted transistor. Current flows into the base of transistor Q2 and this transistor turns on. The emitter current which flows through resistor 22 raises the potential at the emitter of transistor Q2 and in turn forward biases the base-emitter junction of transistor Q5. Assuming a 0.8 volt drop across the base-emitter junction of transistor Q5, the emitter of transistor Q2 is held at 0.8 volt. Assuming the same drop across the base-emitter junction of transistor Q2, the base of transistor Q2 is held at 1.6 volts. Similarly, with the same drop across the base-collector junction of transistor Q1, the base potential of transistor Q1 is 2.4 volts.

With transistor Q2 conducting, its collector potential is 0.2 volt greater than its emitter potential. The base of transistor Q3 is thus held at 1 volt. There is thus only 1 volt to be dropped across the base-emitter junctions of both of transistors Q3 and Q4—an amount insufficient to enable the conduction of the transistors. Consequently, the collector of transistor Q3 is held at the 5-volt potential of source 10 and no current flows through transistors Q3 and Q4. Since transistor Q5 conducts, current flows from the load (not shown) through terminal 40 and transistor Q5. Since the collector-emitter drop of a saturated transistor is 0.2 volt, the collector potential of transistor Q5 is 0.2 volt. With terminal 40 at 0.2 volt, and the base of transistor Q3 held at 1 volt, there is a total of 0.8 volt to be dropped across the base-emitter junctions of transistors Q3 and Q4. Assuming equal drops across the two junctions, it is apparent that the base of transistor Q4 (the emitter of transistor Q3) is held at 0.6 volt.

With transistor Q2 delivering a large emitter current, transistor Q5 can turn on rapidly. The problem with the prior art circuit of FIG. 1 is that when it is necessary to turn the transistor off—by causing any one of the emitter inputs of transistor Q1 to go low in potential—it takes considerable time before the potential at terminal 40 rises from 0.2 volts to 3.4 volts. This is due to the fact that the turn-off delay of transistor Q5 depends upon the speed at which the stored charge in transistor Q5 dissipates. The charge dissipates through resistor 22 and it would appear that the rapid turnoff of transistor Q5 could be controlled by decreasing the magnitude of this resistor. However, if the resistor is decreased in magnitude, a larger current drive from transistor Q2 is required in order to turn on transistor Q5. Since resistor 22 cannot be decreased in magnitude to a negligible value, the turnoff of transistor Q5 is limited in speed. What is often even more of a problem is that due to the variable capacitance which is exhibited by transistor Q5 in several circuits even on the same chip, the turnoff time varies from stage to stage.

The circuit of FIG. 2 is similar to that of FIG. 1 except that resistor 22 of FIG. 1 is replaced by resistors 24 and 26, and diode D is provided between the emitter of transistor Q2 and the collector of transistor Q5. In the illustrative embodiment of the invention, resistor 24 has a magnitude which is half of the magnitude of resistor 26.

When at least one of the emitters of transistor Q1 is low in potential, transistor Q1 conducts and its collector potential is 0.6 volt as in the case of the circuit of FIG. 1. The base-emitter junction of transistor Q2 is not forward biased and no current flows through resistors 24, 26 and diode D. Transistor Q5 remains off as in the case of FIG. 1 and the collector potential of the transistor is at 3.4 volts. The voltage at each of the transistor terminals (the voltages without parentheses) is the same as the voltage at the same terminal in the circuit of FIG. 1.

The operation of the circuit is different, however, when all of the inputs of transistor Q1 go high. In such a case, transistor Q2 conducts and transistor Q5 turns on. With a 0.8 volt drop across the base-emitter junction of transistor Q5, the junction of resistors 24 and 26 is at 0.8 volt. Assuming that the base of transistor Q5 draws negligible current, all of the current which flows through resistor 26 also flows through resistor 24. Since resistor 24 is only half the magnitude of resistor 26, the drop across resistor 24 is only half the drop across resistor 26. Since the drop across resistor 26 is 0.8 volt, the drop across resistor 24 is 0.4 volt, and the emitter of transistor Q2 is held at potential of 1.2 volts. With a 0.8 volt drop across the base-emitter junction of transistor Q2, the base of the transistor is held at 2 volts, and with a similar drop across the base-collector junction of transistor Q1, the base of transistor Q1 is held at a potential of 2.8 volts.

The significant thing to note is that the emitter of transistor Q2 is now held at 1.2 volts rather than 0.8 volt, and the emitter of transistor Q2 is coupled through diode D to the collector of transistor Q5. The drop across diode D is the same as the drop across the base-emitter junction of a transistor. (In practice, diode D can be a transistor whose collector and base terminals are coupled together.) With a 0.8 volt drop across diode D, the cathode of the diode is held at 0.4 volt. Consequently, the collector of transistor Q5 is held at 0.4 volt since it is clamped through diode D to the 1.2 volt potential at the emitter of transistor Q2. Transistor Q5 does not saturate since its collector voltage does not drop to 0.2 volt.

With a 0.2 volt drop across the collector and emitter terminals of transistor Q2, the collector of transistor Q2 is held at a potential of 1.4 volts. Since the emitter of transistor Q4 is at a potential of 0.4 volts, there is a 1 volt drop across the base-emitter junctions of transistors Q3 and Q4. Neither transistor conducts, and assuming an equal drop across each junction the emitter potential of transistor Q3 is 0.9 volt as shown.

The output level of 0.4 volt at terminal 40, while higher than the 0.2 volt level in the circuit of FIG. 1, is still low enough to be considered a "low" level in a TTL integrated circuit. The significance of the higher "low" level is that transistor Q5 can now turn off much faster. There is much less charge stored in the base collector capacitance of transistor Q5 and this charge rapidly dissipates through resistor 26 when one of the inputs to transistor Q1 goes low to control the turning off of transistor Q5. The potential at the collector of transistor Q5 thus rises more rapidly than it does in the prior art circuit of FIG. 1.

It should be noted that the value selected for resistors 24 and 26 determine the "low" collector potential of transistor Q5. The junction of the two resistors is held at a potential of 0.8 volt due to the base-emitter drop of transistor Q5. The relative magnitudes of the resistors determine the potential at the junction of diode D and resistor 24, the potential at output 40 being 0.8 volt less than the potential at this junction. For example, to increase the "low" level potential at terminal 40 to value slightly higher than 0.4 volt, e.g., 0.5 volt, resistor 24 should be increased in magnitude slightly to increase the potential at the junction of the resistor and diode D by 0.1 volt.

Although the invention has been described with reference to a particular embodiment, it is to be understood that this embodiment is merely illustrative of the application of the principles of the invention. Numerous modifications may be made therein and other arrangements may be devised without departing from the spirit and scope of the invention.

What I claim is:

1. A nonsaturated logic circuit comprising an output transistor having emitter, base and collector terminals, a first source of potential, means connecting said emitter terminal to said first source of potential, a voltage divider network including first and second series-connected impedance means, said first impedance means having one end thereof connected to said first source of potential with the junction of said series-connected impedance means being connected to said base terminal, diode means connected between said collector terminal and the other end of said second impedance means, said diode means being poled in the direction of current flow through said collector terminal, drive means for causing current to flow through said first and second impedance means for turning on said output transistor and for lowering the potential of said collector terminal, a second source of potential greater in magnitude than said first source of potential, and means for causing said second source of potential to raise the potential of said collector terminal in the absence of the conduction of said output transistor.

2. A nonsaturated logic circuit in accordance with claim 1 wherein the magnitude of said first and second impedance means relative to each other are such that with the conduction of said diode means and said output transistor the potential at said collector terminal is high enough to prevent saturation of said output transistor.

3. A nonsaturated logic circuit in accordance with claim 2 wherein said first and second impedance means are resistors.

4. A nonsaturated logic circuit in accordance with claim 3 wherein said potential raising means includes current amplifying means connected between said second source of potential and said collector terminal.

5. A nonsaturated logic circuit comprising an output transistor having emitter, base and collector terminals, a first source of potential, means coupling said emitter terminal to said first source of potential, a voltage divider network including first and second series-connected impedance means, said first impedance means having one end thereof connected to said emitter terminal with the junction of said series-connected impedance means being connected to said base terminal, diode means coupled between said collector terminal and the other end of said second impedance means, said diode means being poled in the direction of current flow through said collector terminal, drive means for causing current to flow through said first and second impedance means for turning on said output transistor and for lowering the potential difference between said collector and emitter terminals, a second source of potential, and means for enabling said second source of potential to raise the potential difference between said collector and emitter terminals in the absence of the conduction of said output transistor.

6. A nonsaturated logic circuit in accordance with claim 5 wherein the magnitude of said first and second impedance means relative to each other are such that with the conduction of said diode means and said output transistor the potential difference between said collector and emitter terminals is high enough to prevent saturation of said output transistor.

7. A nonsaturated logic circuit in accordance with claim 6 wherein said first and second impedance means are resistors.

8. A nonsaturated logic circuit in accordance with claim 7 wherein said enabling means includes current amplifying means connected between said second source of potential and said collector terminal.

9. A nonsaturated logic circuit in accordance with claim 5 wherein said first and second impedance means are resistors.

10. A nonsaturated logic circuit in accordance with claim 9 wherein said enabling means includes current amplifying means connected between said second source of potential and said collector terminal.

11. A nonsaturated logic circuit comprising an output transistor having emitter base and collector terminals, a first source of potential, means coupling said emitter terminal to said first source of potential, voltage divider network impedance means having three terminals, means connecting one of said three terminals to said emitter terminal, means connecting a second of said three terminals to said base terminal, unidirectional current conducting clamping means coupled between said collector terminal and the third of said three terminals, said clamping means being poled in the direction of current flow through said collector terminal, drive means for causing current to flow through said voltage divider network impedance means for turning on said output transistor and for lowering the potential difference between said collector and emitter terminals, a second source of potential, and means for enabling said second source of potential to raise the potential difference between said collector and emitter terminals in the absence of the conduction of said output transistor.

12. A nonsaturated logic circuit in accordance with claim 11 wherein said voltage divider network impedance means is such that with the operation of said clamping means and conduction in said output transistor the potential difference between said collector and emitter terminals is high enough to prevent saturation of said output transistor.

13. A nonsaturated logic circuit in accordance with claim 12 wherein said enabling means includes current amplifying means connected between said second source of potential and said collector terminals.

UNITED STATES PATENT OFFICE

CERTIFICATE OF CORRECTION

Patent No. 3,614,467 Dated October 19, 1971

Inventor(s) George K. Tu

It is certified that error appears in the above-identified patent and that said Letters Patent are hereby corrected as shown below:

Column 1, line 15, "transistor" should be -- be -- ; line 60, "emitters" should be -- clamp -- .

Signed and sealed this 17th day of October 1972.

(SEAL)
Attest:

EDWARD M.FLETCHER,JR.
Attesting Officer

ROBERT GOTTSCHALK
Commissioner of Patents